United States Patent [19]

Kogan et al.

[11] Patent Number: 5,557,618
[45] Date of Patent: Sep. 17, 1996

[54] SIGNAL SAMPLING CIRCUIT WITH REDUNDANCY

[75] Inventors: Grigory Kogan, Portland; Boulden G. Griffith, Hillsboro, both of Oreg.

[73] Assignee: Tektronix, Inc., Wilsonville, Oreg.

[21] Appl. No.: 6,284

[22] Filed: Jan. 19, 1993

[51] Int. Cl.$^6$ ............................................. G11C 29/00
[52] U.S. Cl. ............................................. 371/10.3
[58] Field of Search ............................ 371/10.3, 8.1; 365/200, 230.03, 230.06; 364/187; 377/57, 60, 63; 348/616, 246; 395/182.03, 182.05, 182.06, 183.18, 183.17, 184.04

[56] References Cited

U.S. PATENT DOCUMENTS

| | | | |
|---|---|---|---|
| 4,365,319 | 12/1982 | Takemae | 365/200 |
| 4,723,227 | 2/1988 | Murotani | 365/200 |
| 5,200,983 | 4/1993 | Kogan | 377/57 |
| 5,255,234 | 10/1993 | Seok | 365/210 |
| 5,274,593 | 12/1993 | Proebsting | 365/200 |
| 5,297,085 | 3/1994 | Choi et al. | 365/200 |
| 5,315,551 | 5/1994 | Hirayama | 365/200 |

Primary Examiner—Hoa T. Nguyen
Attorney, Agent, or Firm—Boulden G. Griffith

[57] ABSTRACT

A circuit modifies a fast-in, slow-out data acquisition system to provide a redundant analog data acquisition cell (aR) that can be substituted for a defective cell without adversely affecting the timing between acquired samples. This circuit includes a plurality of signal acquisition cells (a1-an) including at least one redundant cell arranged in a row, a source of sample and hold clock signals (b1-bn) for the signal acquisition cells, and a corresponding row of demultiplexers (D1-Dn). Each acquisition cell has an analog signal input and a sample and hold clock signal input that determines when the analog signal is to be sampled. The demultiplexers each have a signal input, a select input, and at least two outputs, with the input being coupled to one of the sample and hold clock signals, and the outputs being coupled to the sample and hold clock inputs of two adjacent signal acquisition cells. The select inputs of the demultiplexers are controlled by either a shift register (FF1-FFn), burnable fuse links (f1-fn), or some other method, to select which demultiplexer output is to receive the sample and hold signal clock so that when a defect is found in one of the signal acquisition cells or related circuitry, the sample and hold clock signal for the defective signal acquisition cell are routed to a different signal acquisition cell. Dummy demultiplexers (DD1-DDn) provide equivalent stray capacitance and other transmission path characteristics to all sample and hold clock signal paths.

12 Claims, 8 Drawing Sheets

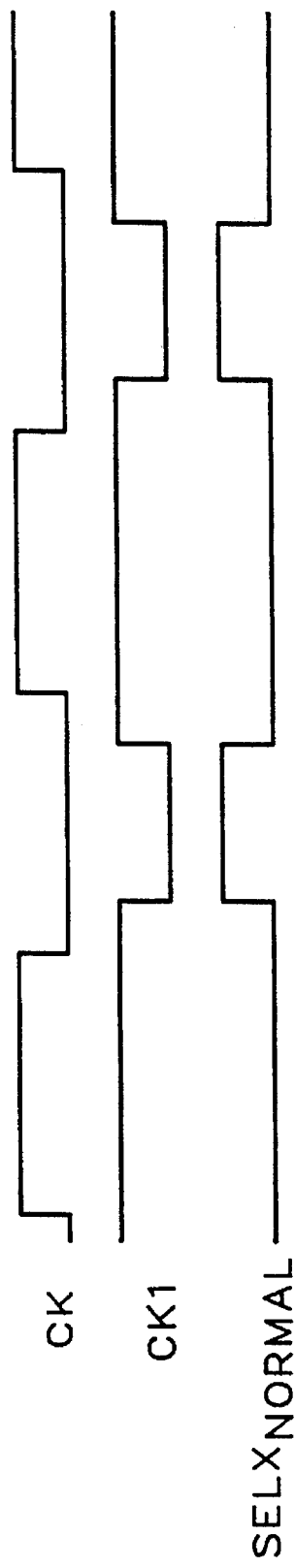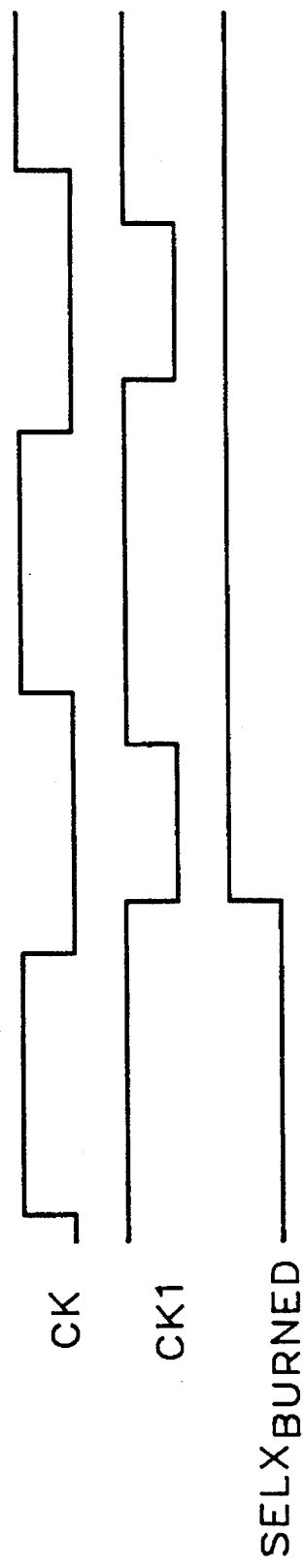

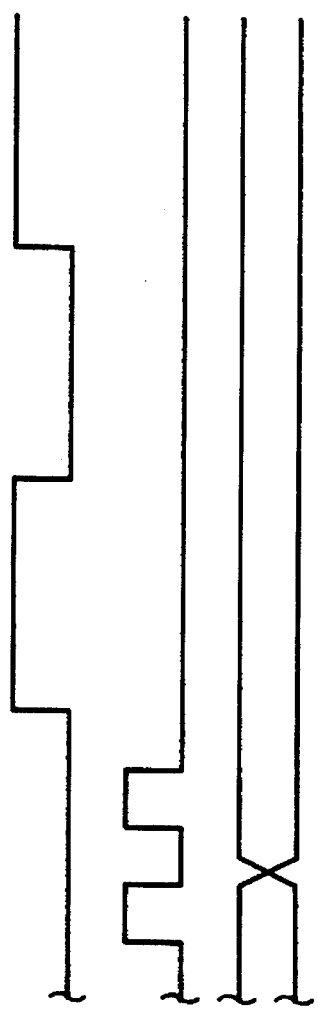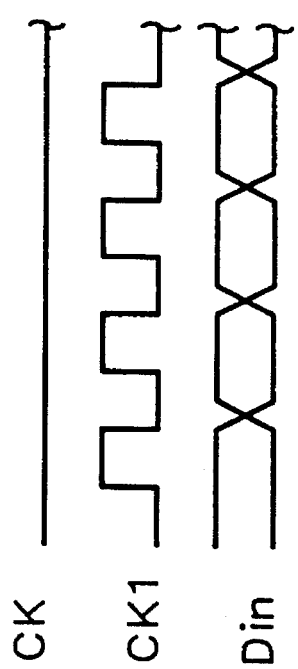
FIG. 6

SIGNAL SAMPLING CIRCUIT WITH REDUNDANCY

FIELD OF THE INVENTION

This invention relates to the provision of redundancy in fast-in, slow-out (FISO) arrays used in CCD-based analog signal acquisition systems, and more particularly to a method of providing such redundancy that preserves the precise timing relationship between adjacent signal paths.

BACKGROUND OF THE INVENTION

Fast-in, slow-out (FISO) arrays are used in systems that acquire analog electrical signals at high sampling speeds. Such a system is disclosed in U.S. Pat. No. 5,144,525 to Saxe et al. for an "Analog Acquisition System Including a High Speed Timing Generator", hereby incorporated by reference. Another, similar, analog signal acquisition system, but one employing charge coupled devices (CCDs) instead of storage capacitors implemented using CMOS (Complementary Metal Oxide on Semiconductor) transistors, is disclosed in co-pending U.S. patent application Ser. No. 07/836,436 by the present inventor for a "FISO Analog Signal Acquisition System Employing CCD Array Storage", hereby incorporated by reference. Neither of these systems provide for FISO array redundancy.

Built-in redundancy is a technique for improving component yields by providing alternative circuitry that can be substituted for normal circuitry that does not operate properly. For example, in the manufacture of random access memories redundancy is typically used in both columns and rows to improve components yields.

FIG. 1 shows one approach that is used to provide row and column addressing redundancy in random access memories. In this very simplified example, two address lines a and b and their complements /a and /b are decoded by row decoders to provide row selection signals. The row decoder for regular rows can be as simple as the AND gate shown decoding the Row Enable #3 signal in this figure. The AND gate in the row decoder for Row Enable #3 is satisfied when a=1 and b=1 (a binary 3). To provide for the replacement of a defective row by a redundant row, the output of each regular row decoder is coupled to the row that it addresses by a laser burnable fuse link, such as the fuse link f5 shown for row 3.

In this approach, redundant rows are addressed by redundant row decoders that are more complex than the normal row decoders. The redundant row decoders receive as inputs all of the address lines and their complements. If all of the regular rows are operating properly and no redundant capabilities are needed, none of the fuse links shown in FIG. 1 need to be cut with a laser. Since both the address bits and their complements are connected to the gates of one of parallel transistors m1-m4, the presence of any address will turn on at least one of these transistors. When any of the transistors m1-m4 are on, they connect the redundant row address signal output to ground, keeping it inactive. Transistor m5 acts as a pull-up resistor, since its channel geometry is chosen to give it a relatively high resistance relative to the other transistors and it is always on because its gate is tied to ground and it is an PMOS transistor.

When there is a defect in one of the rows, that row is permanently disabled by the burning of fuse line f5. The redundant row decoder must then be programmed to respond to the address of the defective row or column. This is accomplished by burning the fuse links within the redundant row decoder that provide a ground path when the address is present that normally would activate the row that has been disabled. In the example here, where Row #3 is assumed to be defective and disabled, burning fuse links f2 and f4 dedicates the redundant row decoder to the task of being a Row #3 decoder substitute. With f2 and f4 gone, the presence of address "11" produces high signal levels on address lines a and b and low signal levels on the inverse address lines /a and/b. The lows on /a and /b keep transistors m1 and m3 turned off, while the absence of f2 and f4 keep m1 and m4 from conducting despite the high levels on their gates. The result is that during address "11" the redundant row output signal goes high.

FIG. 2A is a timing diagram that illustrates the case when all of the normal address rows are operational and no fuse links have been burned, while FIG. 2B is another timing diagram that illustrates the case when Row #3 is defective and fuse links f2, f4, and f5 have been cut to dedicate the redundant row to being a Row #3 substitute.

Obtaining redundancy in a FISO analog signal acquisition system must be approached differently, because the precise timing between successive sample and hold signals (also known as timing strobes) is extremely important. Since different columns in the array have to sample the input signal sequentially at times that are closely and evenly spaced apart, any practical method of providing redundancy must provide equivalent time pathways for each sample and hold signal and the acquired signal. Co-pending U.S. patent application Ser. No. 07/824,434 by the present inventor for a "High Speed Sample and Hold Signal Generator", hereby incorporated by reference, provides an example of how critical this timing requirement is and discloses circuitry for providing high speed sequential sample and hold signals whose temporal spacing is tightly controlled.

What is desired is an approach to providing sample and hold signal clocking to a redundant acquisition cell that maintains its timing relationship relative to the other samples in the acquisition. To maintain this timing relationship, the stray capacitance and other sources of delay in the redundant path must be exactly matched to those in the defective path.

SUMMARY OF THE INVENTION

In accordance with the invention, a circuit modifies a fast-in, slow-out data acquisition system to provide a redundant analog data acquisition cell that can be substituted for a defective cell (or column of storage cells supported by the a cell) without adversely affecting the timing between acquired samples. This circuit includes a plurality of signal acquisition cells including at least one redundant cell arranged in a row, a source of sample and hold clock signals for the signal acquisition cells, and a corresponding row of demultiplexers for distributing the sample and hold clock signals to the signal acquisition cells in such a way as to allow one or two defective cells to be bypassed. Each acquisition cell has an analog signal input and a sample and hold clock signal input that determines when the analog signal is to be sampled. The demultiplexers each have a signal input, a select input, and at least two outputs, with the input being coupled to one of the sample and hold clock signals, and the outputs being coupled to the sample and hold clock inputs of two adjacent signal acquisition cells. The select inputs of the demultiplexers are controlled by either a shift register, burnable fuse links, or some other method, to select which demultiplexer output is to receive the sample and hold signal clock so that, in the absence of any defects, the sample and hold clock signals are routed to an initial set of signal acquisition cells, and when a defect is found in one of the initial set of signal acquisition cells (or the column of storage cells that it is input to), the sample and hold clock signal for the defective signal acquisition cell are routed to a different signal acquisition cell, as are all of the others in one direction down the length of the row of acquisition cells. Dummy demultiplexers provide equivalent stray capacitance and other transmission path characteristics to all sample and hold clock signal paths despite changes in the routing performed by the demultiplexers.

BRIEF DESCRIPTION OF THE DRAWINGS

FIGS. 4A and 4B are timing diagrams illustrating the operation of the circuitry shown in FIG. 3.

FIG. 6 is a timing diagram illustrating the timing of the two clock signals used to operate the circuitry shown in FIGS. 5 and 7.

DETAILED DESCRIPTION OF THE INVENTION

Figure 1:
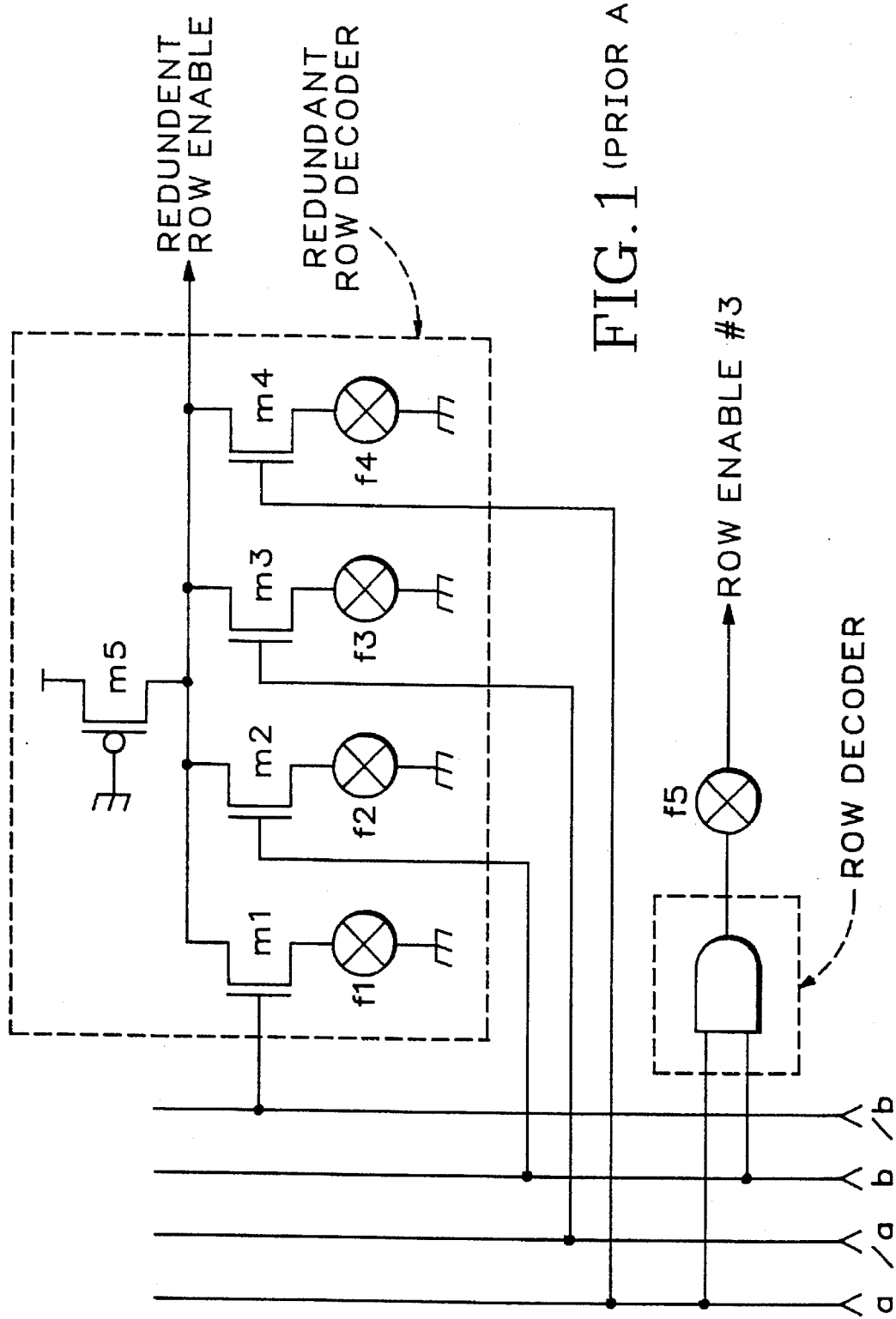
FIG. 1 is a schematic diagram of a prior art approach to providing redundancy in the addressing of a random access memory built with spare rows and columns.
Figure 2A:
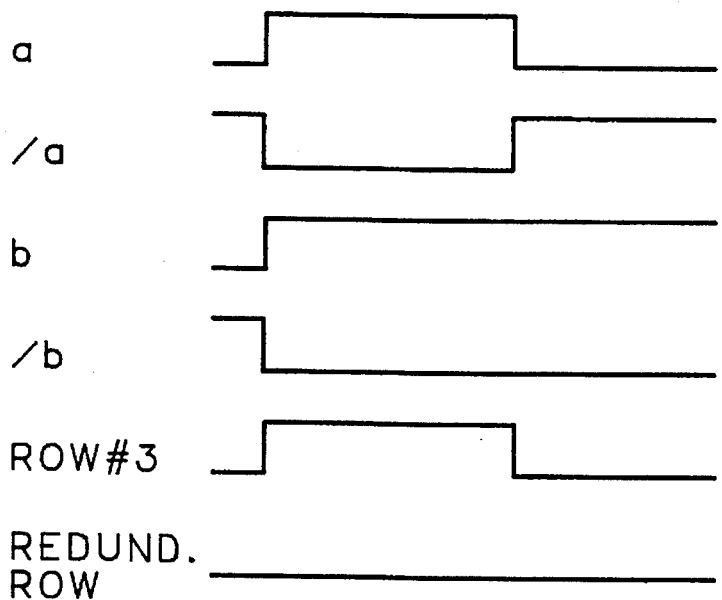
FIGS. 2A and 2B are timing diagrams illustrating the operation of the circuitry shown in FIG. 1.
Figure 2B:
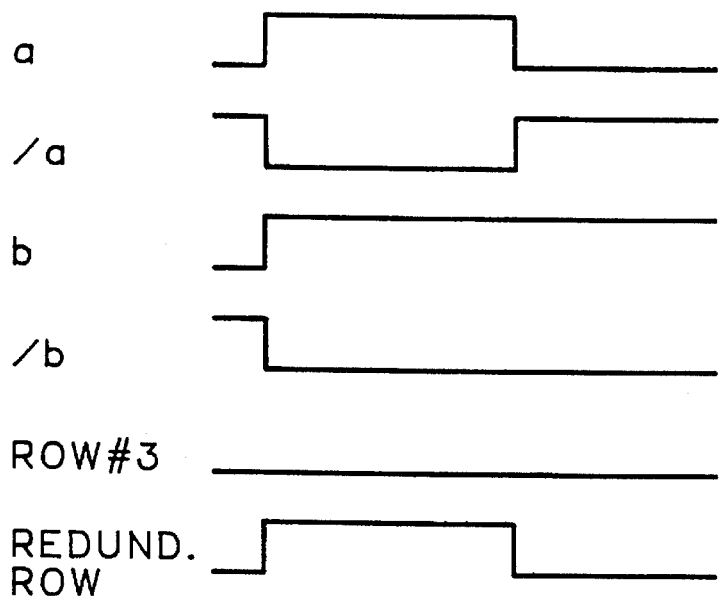
Figure 3:
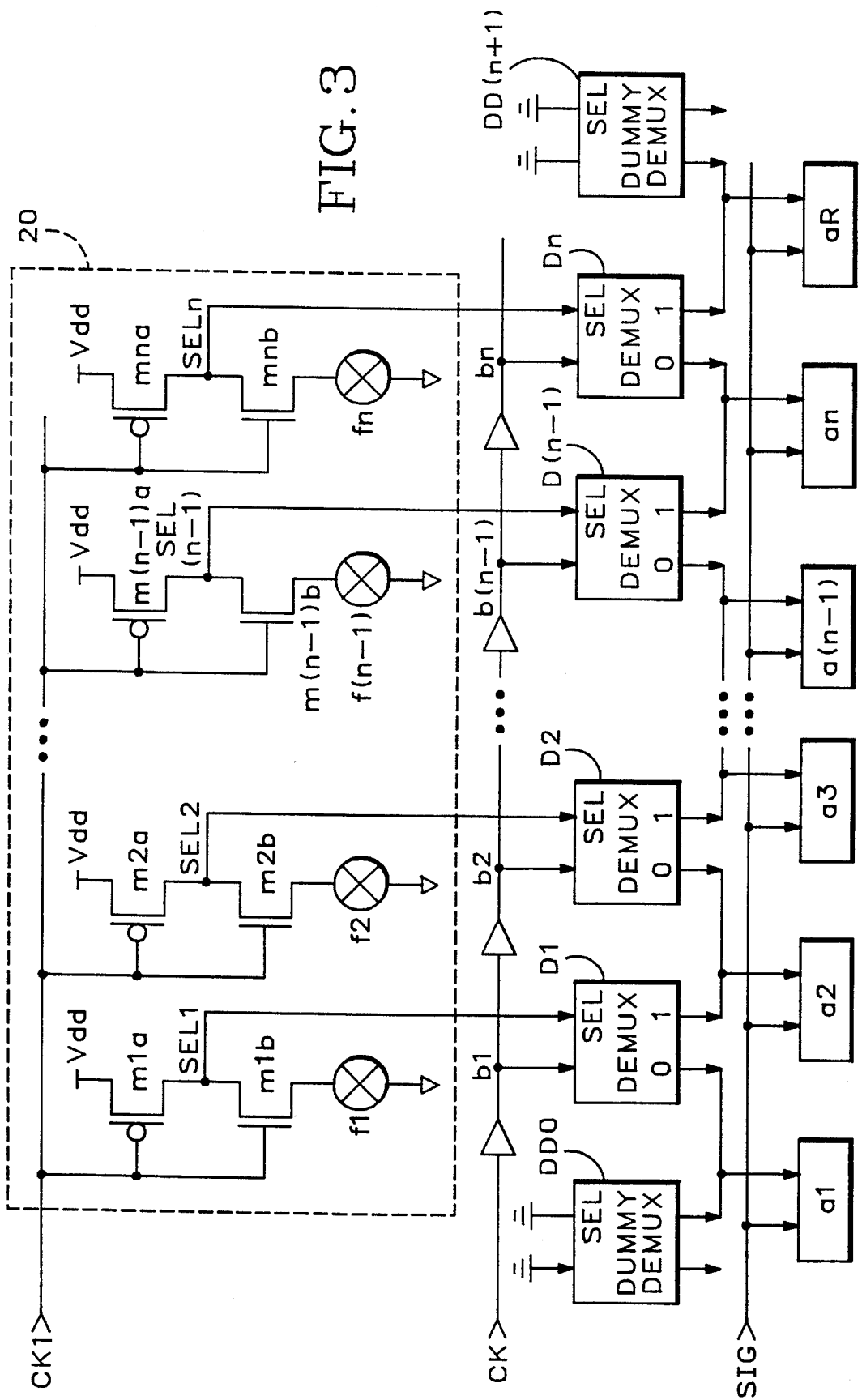
FIG. 3 is a schematic diagram showing the circuit of the present invention for providing suitable clocking to a redundant acquisition cell in a FISO array.

FIG. 3 is a schematic diagram showing the circuit of the present invention for providing clocking to an acquisition cell associated with a redundant column of storage cells in a FISO array. This approach solves the problem of providing sample and hold clock signals to the redundant cell while maintaining the precise timing relationship between successive sample intervals during an acquisition.

The successively delayed clock signals b1-bn are each applied to the inputs of corresponding demultiplexers D1-DN. These successively delayed clock signals then appear at either the 0 or 1 outputs of the demultiplexers D1-DN depending on the state of their SELect inputs. When the SELect inputs to the demultiplexers D1-DN are low, their 0 outputs are selected and the successively delayed clock signals b1-bn are connected to the clock inputs of the corresponding acquisition cells a1-an. When the SELect inputs to the demultiplexers D1-DN are low, their 1 outputs are selected and the successively delayed clock signals b1-bn are connected to the clock inputs of the acquisition cells one position to the right, the a2-aR cells, where R is the redundant n+1 cell.

The SELect inputs SEL1-SELn to the demultiplexers D1-DN are supplied by transistor pairs m1a,m1b-mna,mnb, respectively, which collectively comprise a means for supplying select signals 20. Each of these transistor pairs consists of a PMOS transistor whose source is connected to Vdd and an NMOS transistor whose source is connected to Vss through a fuse link fx. The drains of these transistors are connected together, and that is where the SELx signals originate. The gates of all of these transistors, m1a,m1b-mna,mnb, are controlled by clock signal CK1.

FIG. 4A is a timing diagram illustrating the operation of the transistor pairs that control the SELx signals when they are in their normal condition, with their fuse links fx intact, i.e., $SELx_{NORMAL}$. CK1 is a clock signal with a higher pulse-high duration than CK, the clock from which the sample and hold strobes b1-bn are derived. When the high portion of the CK1 clock signal is applied to the gates of transistors m1a,m1b through mna,mnb, the PMOS transistor mxa in each pair is turned off and the NMOS transistor mxb in each pair is turned on. While the transistors are in this state, the $SELx_{NORMAL}$ signals that they produce are held low by conduction through the NMOS transistor to ground, and the 0 output of the demultiplexers that they control is selected. During the times that the CK1 signal is low, the PMOS transistor mxa in each pair is turned on and the NMOS transistor mxb in each pair is turned off. While the transistors are in this state, the $SELx_{NORMAL}$ signals that they produce are held high by conduction through the PMOS transistor to Vdd, and the 1 output of the demultiplexers that they control is selected. However, since there are no sample and hold strobes b1-bn during this time, no signals pass through the demultiplexers D1-D2 during the time that their 1 outputs are selected.

FIG. 4B is a timing diagram illustrating the operation of the transistor pairs that control the SELx signals when the fuse links fx on the NMOS transistor's source have been burned, i.e., $SELx_{BURNED}$. At turn-on $SELx_{BURNED}$ is initially low. When a fuse link fx has been burned away, the low portion of the CK1 signal turns on the PMOS transistor mxa causing the stray capacitance present at the junction of the drains of the two transistors mxa and mxb to charge. When the high portion of the CK1 signal turns off the PMOS transistor mxa and turns on the NMOS transistor mxb, the $SELx_{BURNED}$ signal remains high. This is because no current can flow through the NMOS transistor mxb because of the open on its source lead, and also because the SELect input of the demultiplexer Dx is designed to have a relatively high input impedance.

To allow use of the redundant (spare) acquisition cell aR, fuse links associated with acquisition cells to the left of the defective cell are left intact, while fuse links associated with the defective acquisition cell and those to the right of it are burned. This causes the $SELx_{NORMAL}$ signals associated with acquisition cells to the left of the defective cell to behave as shown in FIG. 4A, while the $SELx_{BURNED}$ signals associated with the defective acquisition cell and those to the right of it behave as shown in FIG. 4B. For example, if acquisition cell a2 is defective, then f1 is left intact and f2 through fn are burned and severed. Then, sample and hold acquisition strobe b1 continue going to acquisition cell a1, while strobes b2 through bn are routed to acquisition cells a3 through aR, respectively.

Note that the circuit shown in FIG. 3 provides equivalent signal paths and insertion delays for all of the sample and hold strobes b1-bn regardless of whether they are routed to the left or right by the demultiplexers D1-Dn. Furthermore, dummy demultiplexers DD0 and DD(n+1) are provided at the ends of the chain of active demultiplexers D1-Dn to put equivalent loads on all of the signal paths, even those that would otherwise be different because they were at the end of the chain and didn't have equivalent signal path loading.

Figure 5:
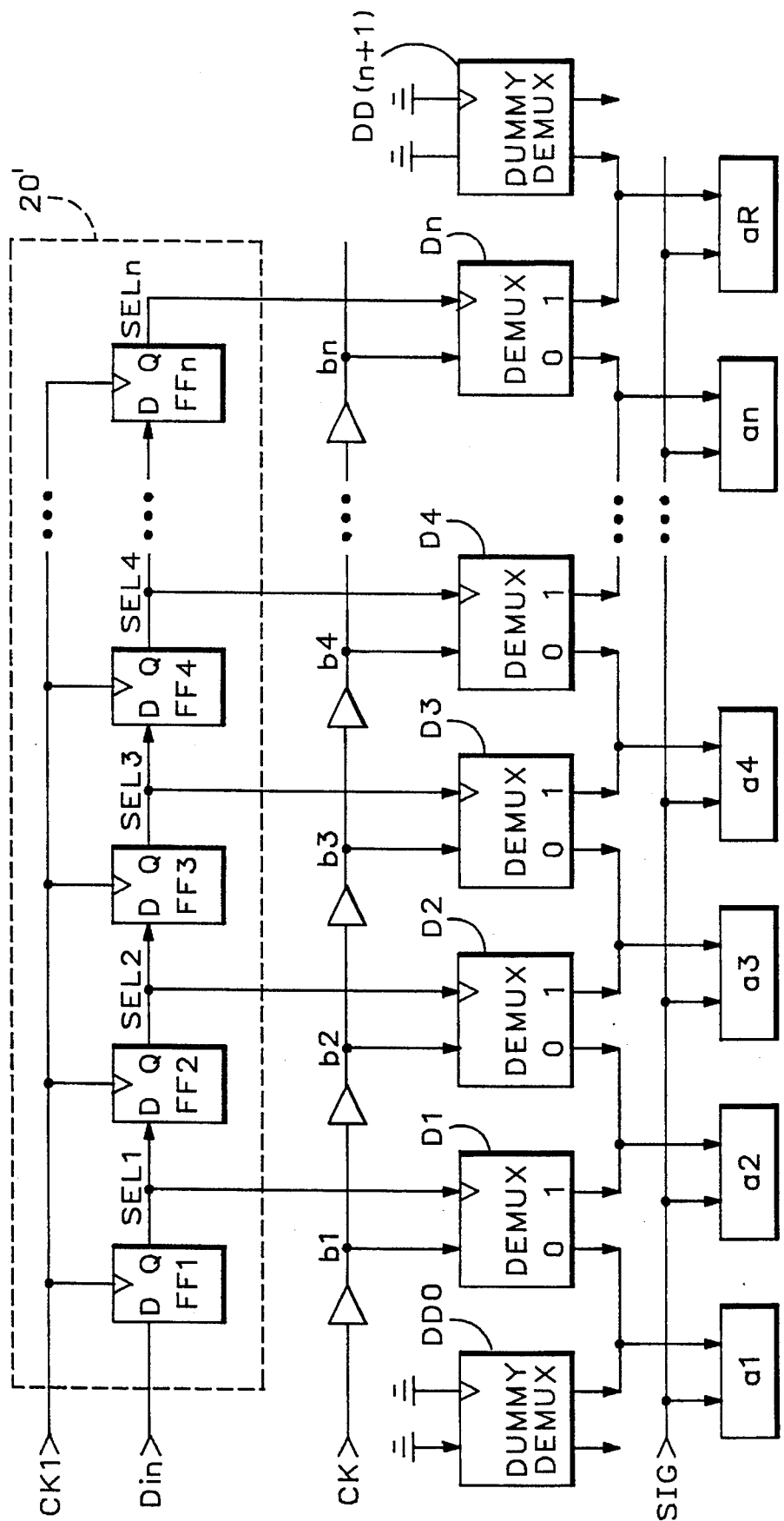
FIG. 5 is a schematic diagram showing an alternative embodiment of the circuit of the present invention.

FIG. 5 shows an alternative version of the circuit of the present invention, a version that is programmable during operation rather than burned once at the factory. In this version of the circuit the SEL1-SELn signals are produced by a means for producing select signals (20') containing a shift register comprising flip-flops FF1-FFn, rather than by the pairs of transistors and fuse link arrangement shown in FIG. 3. As is shown in FIG. 6, serial data Din is moved into the shift register under the control of CK1 before regular operation is commenced under the control of CK. The rest of the circuitry is the same as that shown in FIG. 3 and operates the same way. This version of the invention has the advantage of being fully programmable during operation, thereby allowing channels that fail after the circuit is shipped from the factory to be bypassed with the redundant channel. This capability does, however, require a little more time and software manipulation in order to attain the same result.

Figure 7:
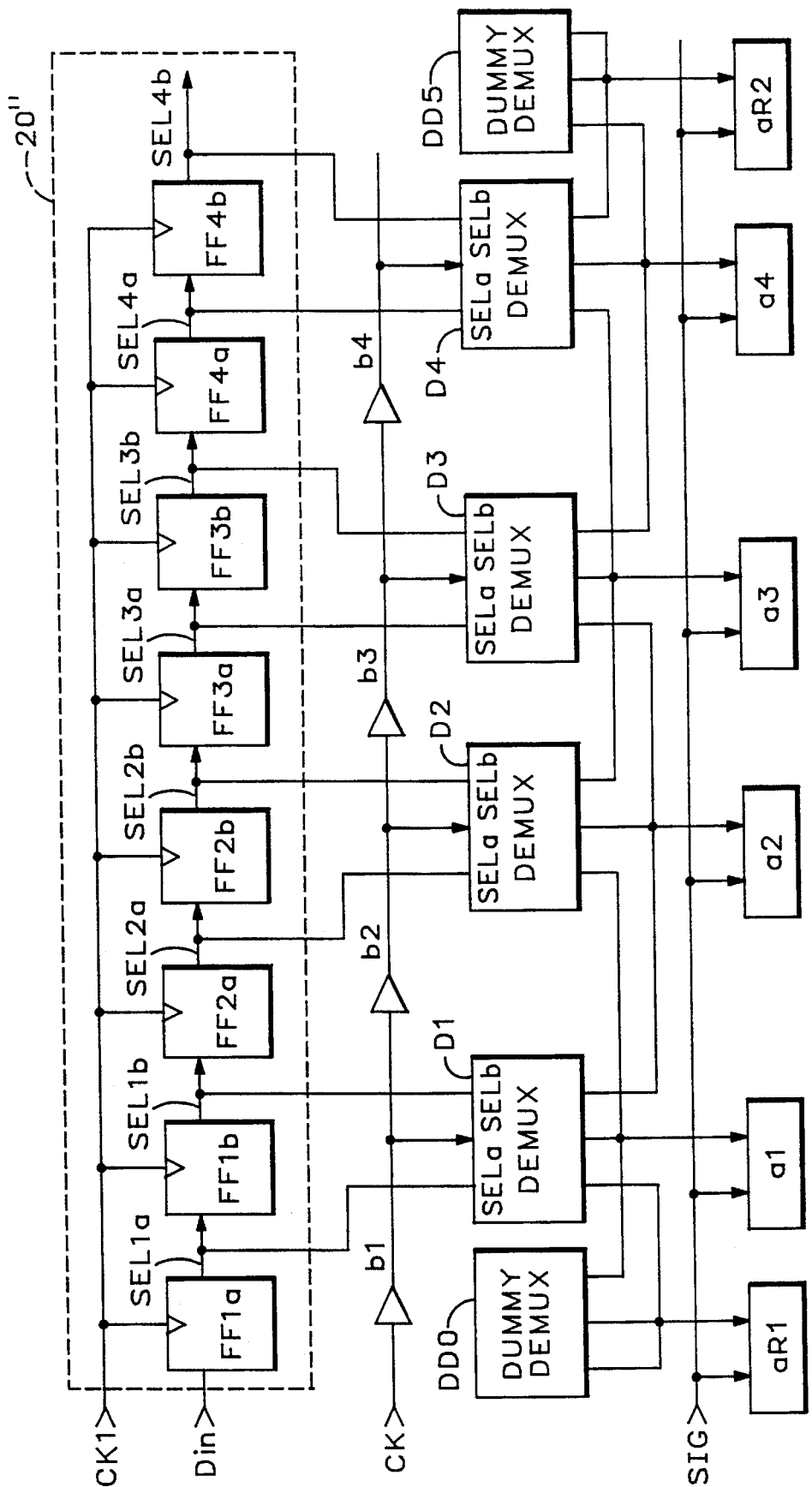
FIG. 7 is a schematic diagram showing another alternative embodiment of the present invention.

The concept of the present invention can be extended to provide more than one redundant path for a given array. FIG. 7 shows an example of a version of the present invention that provides clocking for two redundant acquisition cell paths aR1 and aR2. In this embodiment of the invention, each demultiplexer D1-D4, has three output positions, with the dummy multiplexers DD0 and DD5 assuring that stray capacitance and other signal path characteristics are equalized for each signal path.

Because demultiplexers having three or four outputs require two select signal inputs, SELa and SELb, the shift register of the means for producing select signals 20" must now be twice as long. Accordingly, the shift register now contains twice as many flip-flops FF1a-FFnb (in this case FFna and FFnb are FF4a and FF4b, since the circuit is shown having a finite length). After the shift register has been loaded with its select values according to Din, as shown in FIG. 6, each pair of flip-flops, FFxa and FFxb, produces select values, SELxa and SELxb, that control the corresponding demultiplexer Dx.

Figure 8:
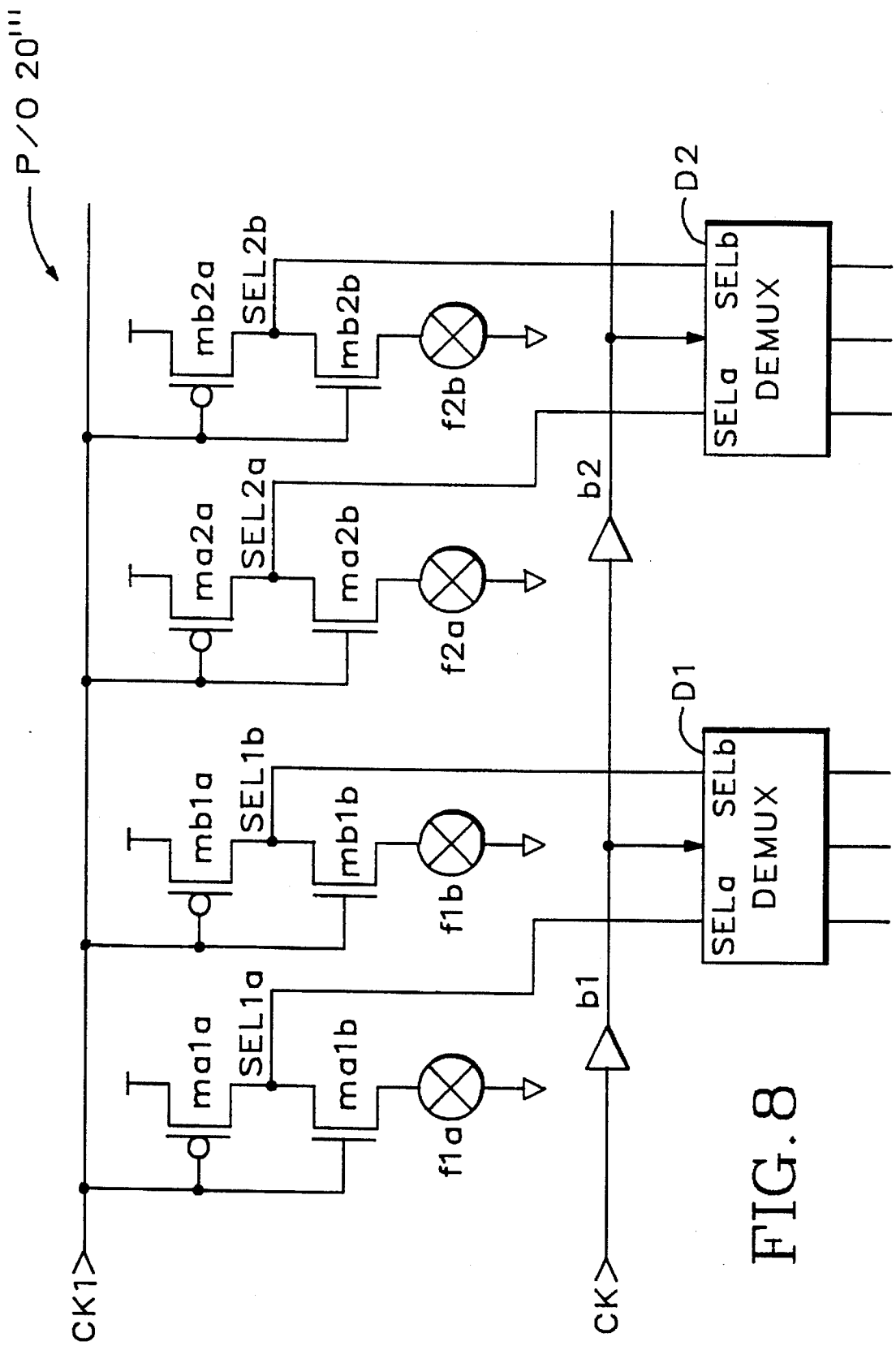
FIG. 8 is a schematic diagram showing yet another alternative embodiment of the present invention.

FIG. 8 shows part of another version of the circuit of the present invention, one which combines the fuse link non-programmable concept of the circuit shown in FIG. 3 with the dual redundant path concept shown in FIG. 7. In this version of the circuit, the select signals SELxa and SELxb are produced by a means for producing select signals 20''' containing transistors as in FIG. 3 and in accordance with permanent information residing in the pattern of burnable fuse links fxa and fxb.

It should be understood that an arrangement of multiplexers corresponding to demultiplexers D1-Dn may be employed at the output end of the CCD arrays associated with acquisition cells a1-an in order to recover and sequentially reconstruct the data defining the behavior of the acquired signal SIG.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

We claim:

1. A circuit for sampling of an input signal comprising:

a source of sample and hold clock signals for providing a plurality of sample and hold clock signals each occurring at successively delayed times;

a plurality of signal routing means arranged in a row, with each signal routing means having a signal input and a select input and first and second outputs, with the signal inputs of the plurality of signal routing means each receiving one of the successively delayed sample and hold clock signals, and each of the signal routing means producing the sample and hold clock signal on its input as either the first or second output depending on the state of the select input;

a row of signal acquisition cells containing a number of signal acquisition cells greater than the number of signal routing means in the plurality of signal routing means, each such cell having an analog signal input coupled to receive the input signal and a sample and hold clock signal input for determining a time at which a sample of the input signal is acquired by each signal acquisition cell, wherein a first acquisition cell in the row of signal acquisition cells has its sample and hold clock signal input coupled to the first output of a first signal routing means of the plurality of signal routing means arranged in a row, and a last acquisition cell in the row of signal acquisition cells has its sample and hold clock signal input coupled in the second output of a last signal routing means of the plurality of signal routing means arranged in a row, and intermediate acquisition cells in the row of signal acquisition cells each have their sample and hold clock signal input coupled to both the second output of a respective preceding signal routing means of the plurality of signal routing means arranged in a row and to the first output of a respective next signal routing means of the plurality of signal routing means arranged in a row, whereby in the absence of any defects in the row of signal acquisition cells signals are applied to the select inputs of the signal routing means so as to cause their first outputs to produce the sample and hold clock signals, but when a defect is determined to be present in one of the signal acquisition cells signals may be applied to the selecting signal routing means so as to cause a subset of them to produce the sample and hold clock signals on their second outputs thereby bypassing the signal acquisition cell that was determined to have the defect.

2. A circuit according to claim 1 wherein the plurality of signal routing means have a third output and the number of signal acquisition cells in the row of signal acquisition cells is at least two greater than the number of signal routing means in the plurality of signal routing means, wherein the first acquisition cell in the row of signal acquisition cells has its sample and hold clock signal input coupled to the first output of a first signal routing means of the plurality of signal routing means arranged in a row, a second acquisition cell in the row of signal acquisition cells has its sample and hold signal input coupled to both the second output of the first acquisition cell in the row of signal acquisition cells and the first output of a second acquisition cell in the row of signal acquisition cells, a last acquisition cell in the row of signal acquisition cells has its sample and hold clock signal input coupled to the third output of a last signal routing means of the plurality of signal routing means arranged in a row, a second to last acquisition cell in the row of signal acquisition cells has its sample and hold signal input coupled to both the second output of the last signal routing means of the plurality of signal routing means and to the third output of a second to last signal routing means of the plurality of signal routing means, and intermediate acquisition cells in the row of signal acquisition cells each have their sample and hold clock signal input coupled to all three of the third output of a respective preceding signal routing means of the plurality of signal routing means arranged in a row and to the second output of a respective corresponding signal routing means of the plurality of signal routing means arranged in a row and to the first output of a respective next signal routing means of the plurality of signal routing means arranged in a row.

3. A circuit according to claim 2 further comprising two dummy signal routing means each having three outputs, the dummy signal routing means disposed to provide two dummy outputs connected to the sample and hold clock signal input of the first and last signal acquisition cells of the row of signal acquisition cells and a single dummy output connected to the sample and hold clock signal input of the second and second to last signal acquisition cell in the row of signal acquisition cells, so that the sample and hold clock inputs of all of the signal acquisition cells have three input connections and the signal paths between the signal routing means outputs and acquisition cell inputs all appear electrically equivalent.

4. A circuit according to claim 2 wherein the signal routing means are multiplexers having a signal input, two select inputs, and at least three outputs.

5. A circuit according to claim 2 further comprising means for supplying select signals to the select inputs of the plurality of signal routing means.

6. A circuit according to claim 5 wherein the means for supplying select signals comprises a shift register.

7. A circuit according to claim 5 wherein the means for supplying select signals comprises burnable fuse links.

8. A circuit according to claim 1 further comprising two dummy signal routing means disposed to provide a dummy first output connected to the sample and hold clock signal input of the first signal acquisition cell and a dummy second output connected to the sample and hold clock signal input of the last signal acquisition cell, so that the first and last signal acquisition cells as well as the intermediate signal acquisition cells of the plurality of signal acquisition cells each have two inputs and all of the signal paths between the signal routing means outputs and acquisition cell inputs appear electrically equivalent.

9. A circuit according to claim 1 wherein the signal routing means are demultiplexe 10. A circuit according to claim 1 further comprising means for supplying select signals to the select inputs of the plurality of signal routing means.

11. A circuit according to claim 10 wherein the means for supplying select signals comprises a shift register.

12. A circuit according to claim 10 wherein the means for supplying select signals comprises burnable fuse links.

* * * * *